(12) United States Patent
Ito

(10) Patent No.: US 11,367,555 B2
(45) Date of Patent: Jun. 21, 2022

(54) MOUNTING SUBSTRATE

(71) Applicant: Murata Manufacturing Co., Ltd., Nagaokakyo (JP)

(72) Inventor: Shingo Ito, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 897 days.

(21) Appl. No.: 16/175,884

(22) Filed: Oct. 31, 2018

(65) Prior Publication Data

US 2019/0074127 A1    Mar. 7, 2019

Related U.S. Application Data

(63) Continuation of application No. PCT/JP2018/006515, filed on Feb. 22, 2018.

(30) Foreign Application Priority Data

Mar. 1, 2017   (JP) .............................. JP2017-038556

(51) Int. Cl.
*H01F 5/00*    (2006.01)
*H01F 27/06*    (2006.01)
(Continued)

(52) U.S. Cl.
CPC ............ *H01F 27/06* (2013.01); *B06B 1/045* (2013.01); *H01F 17/0013* (2013.01);
(Continued)

(58) Field of Classification Search
USPC .................................. 336/200, 232, 192, 198
See application file for complete search history.

(56) References Cited

U.S. PATENT DOCUMENTS

2013/0222101 A1    8/2013  Ito et al.
2014/0009254 A1*   1/2014  Ohkubo ................ H01F 27/022
                                                  336/192
(Continued)

FOREIGN PATENT DOCUMENTS

EP    0 685 857 A1    12/1995
JP    07-335439 A     12/1995
(Continued)

OTHER PUBLICATIONS

Official Communication issued in International Patent Application No. PCT/JP2018/006515, dated May 1, 2018.

*Primary Examiner* — Shawki S Ismail
*Assistant Examiner* — Kazi S Hossain
(74) *Attorney, Agent, or Firm* — Keating & Bennett, LLP

(57) ABSTRACT

A mounting substrate includes a resin layer and a first conductor including a contact surface in contact with the resin layer. The first conductor includes a first surface facing toward the mounting surface and a second surface on a side opposite to the first surface and extends in a direction parallel or substantially parallel to the mounting surface. The first conductor has a difference of a maximum value and a minimum value of a distance between the first surface and the mounting surface smaller than a difference of a maximum value and a minimum value of a distance between the second surface and the mounting surface. The resin layer includes a resin wall portion surrounding an opening portion partially exposing the first conductor on the mounting surface side, and the first conductor includes an exposed portion defining a mounting electrode.

19 Claims, 10 Drawing Sheets

(51) Int. Cl.

| | |
|---|---|
| *H01F 41/04* | (2006.01) |
| *H01F 27/29* | (2006.01) |
| *H04R 9/00* | (2006.01) |
| *H01F 17/00* | (2006.01) |
| *H05K 1/16* | (2006.01) |
| *B06B 1/04* | (2006.01) |
| *H04R 9/06* | (2006.01) |
| *H04R 31/00* | (2006.01) |
| *H01F 27/28* | (2006.01) |
| *H01F 41/26* | (2006.01) |
| *H05K 3/24* | (2006.01) |
| *H05K 3/46* | (2006.01) |
| *H05K 3/10* | (2006.01) |

(52) U.S. Cl.
CPC ....... *H01F 27/2804* (2013.01); *H01F 27/292* (2013.01); *H01F 41/04* (2013.01); *H01F 41/041* (2013.01); *H01F 41/26* (2013.01); *H04R 9/00* (2013.01); *H04R 9/06* (2013.01); *H04R 31/00* (2013.01); *H05K 1/16* (2013.01); *H05K 1/165* (2013.01); *H05K 3/24* (2013.01); *H01F 2027/065* (2013.01); *H05K 3/108* (2013.01); *H05K 3/4661* (2013.01)

(56) References Cited

U.S. PATENT DOCUMENTS

| | | | |
|---|---|---|---|
| 2017/0004917 A1* | 1/2017 | Yang | C25D 7/001 |
| 2017/0135206 A1 | 5/2017 | Ueda et al. | |
| 2019/0259522 A1* | 8/2019 | Kim | H01F 27/06 |
| 2019/0362886 A1* | 11/2019 | Bong | H01F 17/0013 |

FOREIGN PATENT DOCUMENTS

| | | |
|---|---|---|
| JP | 2003-299184 A | 10/2003 |
| JP | 2009-10268 A | 1/2009 |
| JP | 2012-248630 A | 12/2012 |
| JP | 2016-9854 A | 1/2016 |
| WO | 2017/199746 A1 | 11/2017 |

* cited by examiner

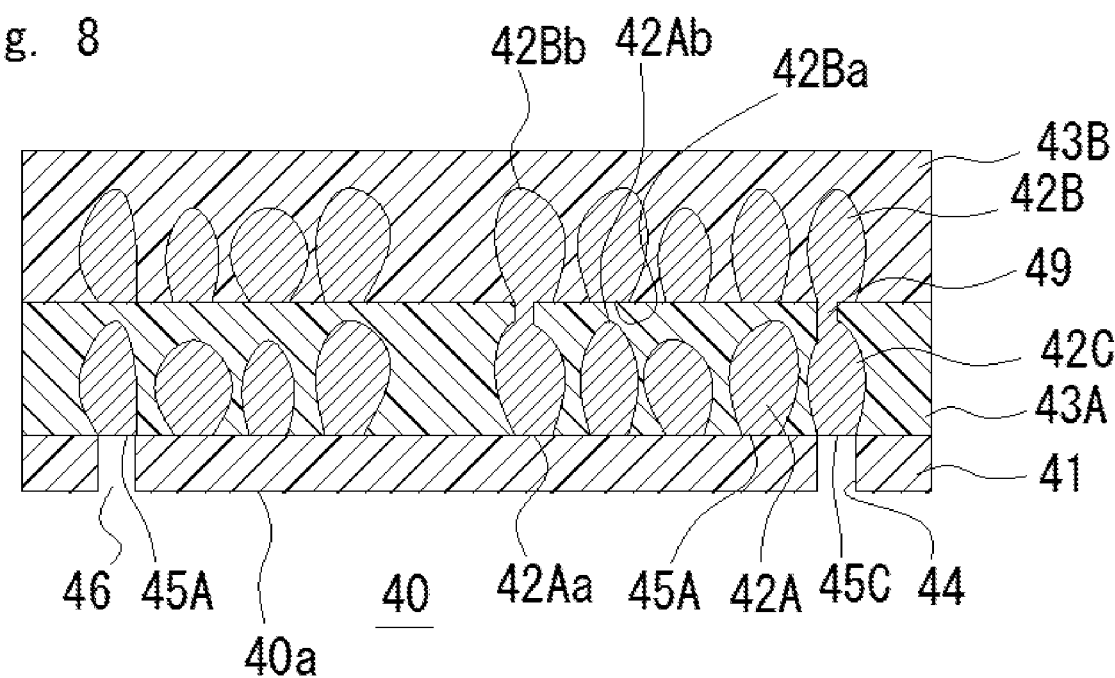

US 11,367,555 B2

MOUNTING SUBSTRATE

CROSS REFERENCE TO RELATED APPLICATIONS

This application claims the benefit of priority to Japanese Patent Application No. 2017-038556 filed on Mar. 1, 2017 and is a Continuation Application of PCT Application No. PCT/JP2018/006515 filed on Feb. 22, 2018. The entire contents of each application are hereby incorporated herein by reference.

BACKGROUND OF THE INVENTION

1. Field of the Invention

The present disclosure relates to a mounting substrate.

2. Description of the Related Art

In a known planar coil structure, a printed circuit board technique is applied to a structure of a coil component. For example, Japanese Laid-Open Patent Publication No. 2012-248630 describes a coil component including a planar spiral conductor formed by electroplating on both surfaces of a substrate.

SUMMARY OF THE INVENTION

Preferred embodiments of the present invention provide mounting substrates. The mounting substrates each include a resin layer and a first conductor including a contact surface in contact with the resin layer. The resin layer includes a smooth mounting surface. The first conductor includes a first surface facing toward the mounting surface and a second surface on a side opposite to the first surface and extends in a direction parallel or substantially parallel to the mounting surface. The first conductor has a non-uniform thickness varying a distance between the first surface and the second surface along an extending direction. The first conductor has a difference of a maximum value and a minimum value of a distance between the first surface and the mounting surface made smaller than a difference of a maximum value and a minimum value of a distance between the second surface and the mounting surface. The resin layer includes a resin wall portion surrounding an opening portion partially exposing the first conductor on the mounting surface side. The first conductor includes an exposed portion defining a mounting electrode.

The above and other elements, features, steps, characteristics and advantages of the present invention will become more apparent from the following detailed description of the preferred embodiments with reference to the attached drawings.

BRIEF DESCRIPTION OF THE DRAWINGS

FIG. 8 is an example of a cross-sectional view of a mounting substrate according to a fourth preferred embodiment of the present invention.

DETAILED DESCRIPTION OF THE PREFERRED EMBODIMENTS

Figure 13:
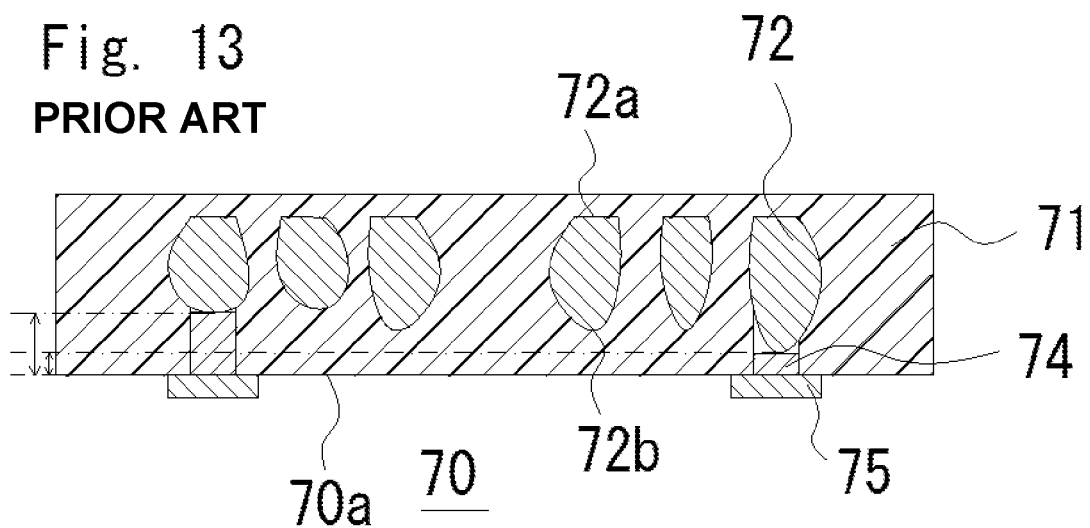
FIG. 13 is an example of a cross-sectional view of a mounting substrate according to a conventional technique.

When a planar spiral conductor is formed to be thick by electroplating, a rate of growth of the conductor by electroplating tends to vary, so that the planar spiral conductor may have non-uniform film thickness. Additionally, when a lead-out conductor extending continuously from an end portion is formed by electroplating at an end portion of the planar spiral conductor as a mounting electrode, the film thickness of the mounting electrode becomes non-uniform. When bonded onto a mounting substrate, a coil component having such a planar spiral conductor or mounting electrode causes a problem in that a bonding failure occurs due to a non-uniform conductor shape. For example, a mounting substrate 70 shown in FIG. 13 includes a resin layer 71 and a conductor 72 enclosed in the resin layer 71. The conductor 72 has a coil shape including a series of conductors, for example, and is formed through plating growth of conductors in a direction toward a mounting surface 70*a* from a side opposite to the mounting surface 70*a* of the resin layer 70. The conductor 72 includes a first surface 72*a*, which is a starting surface of the plating growth, and a second surface 72*b* on the opposite side, and variations in the rate of growth of the conductors by electroplating make a distance from the first surface 72*a* to the second surface 72*b* non-uniform between conductor portions. Therefore, when the mounting surface 70*a* is on the second surface 72*b* side of the resin layer 71 and opening portions are provided on the mounting surface side to form mounting electrodes as in the mounting substrate 70, a difference in distance of the mounting surface 70*a* and the mounting electrodes is increased between conductor portions. As a result, when the mounting substrate 70 is bonded to a connection terminal 75 by a bonding member 74, a bonding failure tends to occur. In view of this problem, preferred embodiments of the present invention provide a mounting substrate that reduces or prevents the occurrence of a bonding failure at a mounting electrode.

A mounting substrate according to a preferred embodiment of the present invention includes a resin layer and a first conductor including a contact surface in contact with the resin layer. The resin layer includes a smooth mounting surface. The first conductor includes a first surface facing toward the mounting surface and a second surface on the side opposite to the first surface and extends in a direction parallel or substantially parallel to the mounting surface. The first conductor has a non-uniform thickness varying a distance between the first surface and the second surface along an extending direction. The first conductor has a difference of a maximum value and a minimum value of a distance between the first surface and the mounting surface made smaller than a difference of a maximum value and a minimum value of a distance between the second surface and the mounting surface. The resin layer includes a resin wall portion surrounding an opening portion partially exposing the first conductor on the mounting surface side. The first conductor includes an exposed portion of a mounting electrode.

Although the first conductor has a non-uniform thickness in a direction orthogonal or substantially orthogonal to the mounting surface, the first surface, i.e., a surface of the first conductor on the side exposed in the opening portion, is formed such that a difference in height becomes smaller than that of the second surface opposite to the first surface and, therefore, has a smaller difference in distance from the mounting surface. Thus, solder is able to sufficiently wrap around to the entire or substantially the entire mounting electrode disposed at the exposed portion of the first conductor when mounting on the substrate, and the occurrence of bonding failure is reduced or prevented. Furthermore, the difference in distance from the mounting surface is reduced between production lots, which enables efficient manufacturing. On the other hand, the second surface of the first conductor has a larger difference in distance from the mounting surface and may have a non-planar shape. Therefore, when the mounting electrode is disposed on the second surface side, the solder tends to defectively wrap around to the mounting electrode, which may increase the rate of occurrence of bonding failure. The difference of the maximum value and the minimum value of the distance between the first surface and the mounting surface is calculated by subtracting the minimum value from the maximum value, and the same applies to the difference of the maximum value and the minimum value of the distance between the second surface and the mounting surface.

The first conductor may include a first coil portion having a winding axis orthogonal or substantially orthogonal to the mounting surface and wound to define a contact surface in contact with the resin layer. Since the first conductor includes the first coil portion, the mounting substrate is able to be applied to a coil component.

The first coil portion may preferably have an average value of about 1 or more, for example, of a ratio of a thickness in the winding axis direction to a thickness in a width direction orthogonal or substantially orthogonal to the winding axis direction and a winding direction. A conductor portion defining the first coil portion has a conductor thickness that is a thickness in the winding axis direction in a cross section orthogonal or substantially orthogonal to the winding direction and a conductor width that is a width in a direction orthogonal or substantially orthogonal to the winding axis direction. Since the conductor of the first coil portion preferably has an aspect ratio of about 1 or more, for example, defined as a ratio of the conductor thickness to the conductor width, the cross-sectional area of the conductor of the first coil portion is able to be increased while increasing the number of turns of a coil pattern, so that the conductor loss is reduced. For example, by forming the first conductor by an electroplating method, the average value of the ratio of the thickness in the winding axis direction to the thickness in the width direction of the conductor is able to be made equal to or greater than about one. When the first conductor is formed by the electroplating method, the first conductor has a non-uniform thickness in a direction orthogonal or substantially orthogonal to the mounting surface. Therefore, if the second surface on the side opposite to the first surface of the first conductor is used as the mounting electrode, bonding failure is likely to occur on the mounting surface. In the present preferred embodiment, the occurrence of bonding failure is reduced or prevented by using the exposed portion of the first surface of the first conductor as a mounting electrode.

Preferably, the first coil portion may include adjacent conductor portions and may have an average value of about 0.5 or less, for example, of a ratio of a gap between the adjacent conductor portions to the thickness of one of the conductor portions. In the first coil portion, conductor portions of a series of conductors may be provided adjacently to each other in some cases. By increasing the thickness of the conductors in the winding axis direction and decreasing the gap between the adjacent conductor portions, the cross-sectional area of the conductor of the first coil portion is able to be increased while increasing the number of turns of a coil pattern, so that the conductor loss is reduced. For example, by forming the first conductor by an electroplating method, the average value of the ratio of the gap between the adjacent portions of the conductor to the thickness of the conductor is able to be made equal to or less than about 0.5, for example. When the first conductor is formed by the electroplating method, the first conductor may have a non-uniform thickness in a direction orthogonal or substantially orthogonal to the mounting surface. Therefore, if the second surface on the side opposite to the first surface of the first conductor is used as the mounting electrode, bonding failure is likely to occur on the mounting surface. In the present preferred embodiment, the occurrence of bonding failure is reduced or prevented by using the exposed portion of the first surface of the first conductor as a mounting electrode.

The first surface of the first conductor may be provided on a plane parallel or substantially parallel to the mounting surface. As a result, the distance between the mounting surface and the mounting electrode is able to be more uniform, so that the occurrence of bonding failure is more effectively reduced or prevented.

The first coil portion may preferably have a planar spiral shape, for example. With a planar spiral shape, the number of turns of the coil is able to be increased. The planar spiral shape means that a shape including a series of spirally wound conducting bodies on the same or substantially the same plane and including an inner circumferential portion and an outer circumferential portion. Being on substantially the same plane means that the spiral shape does not continuously extend in the winding axis direction. In the planar spiral shape, the spirally wound conductor may include linear portions or may define circular or elliptical curved lines.

The mounting substrate may further include a second conductor including a contact surface in contact with the resin layer and connected to the first conductor. The second electric conductor may include a first surface facing toward the mounting surface and a second surface on the side opposite to the first surface and may extend in a direction parallel or substantially parallel to the mounting surface and may have a non-uniform thickness varying a distance between the first surface and the second surface along an extending direction. Since the conductors are provided on multiple layers, the strength of an electromagnetic field generated by a driving current is larger when the mounting substrate is used for a coil component, for example.

A difference of a maximum value and a minimum value of a distance between the first surface of the second conductor and the mounting surface may be made smaller than a difference of a maximum value and a minimum value of a distance between the second surface of the second conductor and the mounting surface. Since the first surface of the second conductor faces the second surface of the first conductor, the variation of the distance between the first conductor and the second conductor is reduced, and the occurrence of bonding failure is reduced or prevented at a connecting portion between the first conductor and the second conductor.

The first surface of the second conductor may be provided on a plane parallel or substantially parallel to the mounting surface. As a result, the occurrence of bonding failure is more effectively reduced or prevented at the connecting portion between the first conductor and the second conductor.

The second conductor may include a second coil portion having a winding axis orthogonal or substantially orthogonal to the mounting surface and wound to define a contact surface in contact with the resin layer. Since the second conductor includes the second coil portion, the mounting substrate is able to be applied to a coil component, and the strength of the electromagnetic field is able to be increased.

The second coil portion may preferably have an average value of about 1 or more, for example, of a ratio of a thickness in the winding axis direction to a thickness in a width direction orthogonal or substantially orthogonal to the winding axis direction and a winding direction. As a result, the cross-sectional area of the conductor of the first coil portion is able to be increased while increasing the number of turns of a coil pattern, so that the conductor loss is reduced.

Preferably, the second coil portion may include adjacent conductor portions and may have an average value of about 0.5 or less, for example, of a ratio of a gap between the adjacent conductor portions to the thickness of one of the conductor portions. As a result, the cross-sectional area of the conductor of the first coil portion is able to be increased while increasing the number of turns of a coil pattern, so that the conductor loss is reduced.

The second coil portion may preferably have a planar spiral shape, for example. With a planar spiral shape, the number of turns of the coil is able to be increased.

In the mounting substrate, an average value of the distance between the mounting surface and the first surface of the first conductor may be smaller than a minimum value of the distance between the first surface of the first conductor and the second surface of the first conductor. As a result, the thickness is able to be reduced as a whole. Although the mounting substrate is able to be easily deformed when the thickness is reduced, the occurrence of bonding failure is reduced or prevented on the mounting surface.

Another preferred embodiment of the present invention provides an electric element including the mounting substrate, and a support substrate including a connection terminal. A mounting electrode of the mounting substrate is bonded via a bonding member to the connection terminal of the support substrate. By using the mounting substrate, the occurrence of bonding failure is reduced or prevented when the electric element is formed. Additionally, the electric element may have an improved bonding strength between the mounting substrate and the supporting substrate.

Another preferred embodiment of the present invention provides a vibrating plate including the mounting substrate. As a result, the occurrence of bonding failure is reduced or prevented when the vibrating plate is mounted on a housing or other structure.

Another preferred embodiment of the present invention provides an electric component including the mounting substrate; a housing including a connection terminal; and a magnet. The mounting electrode of the mounting substrate is bonded via a bonding member to the connection terminal. The magnet is provided on the side opposite to the mounting surface of the mounting substrate. Since the mounting electrode of the mounting substrate is bonded via the bonding member to the connection terminal, the occurrence of bonding failure is reduced or prevented, and the electric element may have an improved bonding strength between the mounting substrate and the housing. The electric element includes the magnet facing the mounting substrate and, therefore, defines and functions as a vibrating element, for example.

A method of manufacturing a mounting substrate according to a preferred embodiment of the present invention includes preparing a resin layer including an underlying metal layer on at least one surface; forming a resist in a partial region on the underlying metal layer; precipitating a metal forming a conductor by electroplating in a region without the resist in the underlying metal layer; removing the resist; forming a first conductor by precipitating a metal by electroplating on the formed conductor; and forming an opening portion partially exposing the first conductor on a surface of the resin layer on the side opposite to the surface on which the first conductor is formed. By forming the first conductor by an electroplating method, the mounting substrate with less conductor loss is able to be manufactured.

Preferred embodiments of the present invention will now be described with reference to the drawings. It is noted that the preferred embodiments described below are examples of an electric element for describing the technical ideas of the present invention, and preferred embodiments of the present invention are not limited to the electric element described below. The members described in claims are not limited to the members of the preferred embodiments in any way. Particularly, the dimensions, materials, shapes, relative arrangements, and other features and elements of the portions described in the preferred embodiments are merely illustrative examples and are not intended to limit the scope of the present invention only thereto unless otherwise specified. In the drawings, the same or substantially the same portions are denoted by the same reference numerals. Although the preferred embodiments are separately described for convenience and to facilitate explanation or understanding of main points, configurations described in different preferred embodiments may partially be replaced or combined. In second and subsequent preferred embodiments, matters common to the first preferred embodiment will not be described, and only the differences will be described. Particularly, the same or substantially the same advantageous effects according to the same configuration will not be described in each preferred embodiment.

First Preferred Embodiment

Figure 1:
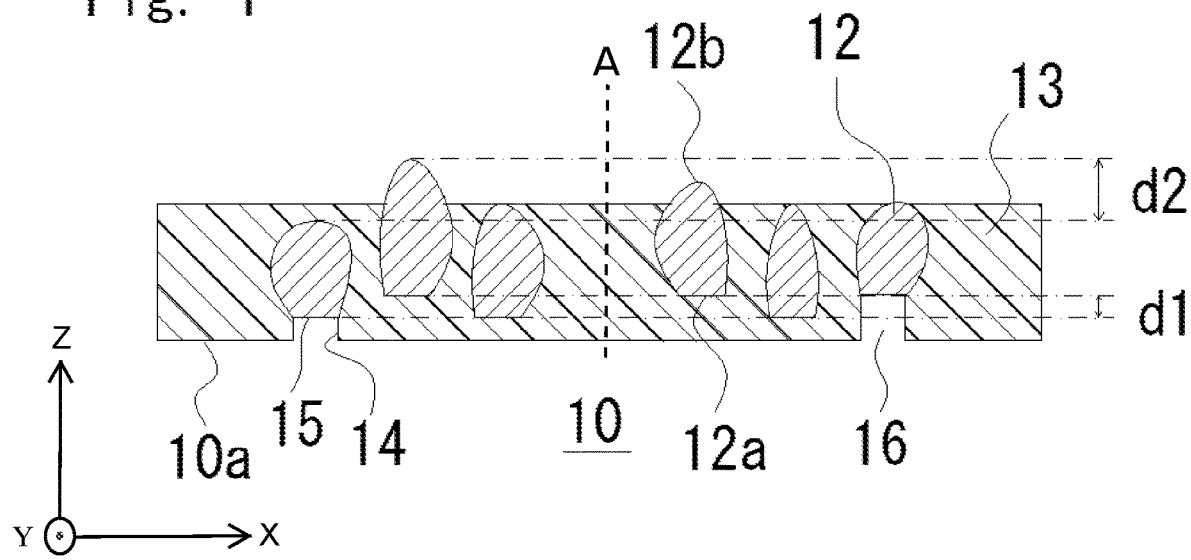
FIG. 1 is an example of a cross-sectional view of a mounting substrate according to a first preferred embodiment of the present invention.

FIG. 1 is a schematic cross-sectional view of a mounting substrate 10 according to a first preferred embodiment of the present invention. The mounting substrate 10 includes a resin layer 13 and a first conductor 12 and includes an opening portion 16 partially exposing the first conductor 12 on a smooth mounting surface 10a. The opening portion 16 is surrounded by a resin wall portion 14, and an exposed portion 15 of the first conductor defines a mounting electrode. In the mounting substrate 10, the first conductor 12 includes a contact surface in contact with the resin layer 13. In FIG. 1, the first conductor 12 includes a conductor portion entirely or substantially entirely buried in the resin layer 13 and a partially-buried and partially-exposed conductor portion. The first conductor 12 includes a first surface 12a facing toward the mounting surface 10a and a second surface 12b on the opposite side and extends in a direction parallel or substantially parallel to the mounting surface 10a in a coil shape, for example. The first conductor 12 has a non-uniform thickness varying a distance between the first surface 12a and the second surface 12b along an extending direction (e.g., a Y-axis direction). For example, in FIG. 1, the conductor portions viewed in a cross section are different in thickness in the direction orthogonal or substantially orthogonal to the mounting surface depending on each of the conductor portions. Additionally, in FIG. 1, a distance is also non-uniform between the first surface 12a of the first conductor 12 and the mounting surface 10a. The first conductor 12 is structured such that a difference d1 of a maximum value and a minimum value of the distance between the first surface 12a of the first conductor 12 and the mounting surface 10a is smaller than a difference d2 of a maximum value and a minimum value of the distance between the second surface 12b of the first conductor 12 and the mounting surface 10a. For example, d1 may preferably be about 0 µm or more and about 5 µm or less and, for example, d2 may preferably be greater than about 0 µm and about 10 µm or less, for example. The first conductor 12 is preferably made of a metal such as copper, for example, and the resin layer 14 preferably includes, for example, at least one of a thermoplastic resin and a thermosetting resin.

In the mounting substrate 10, the first conductor 12 defining the substrate has a smaller difference due to unevenness of the conductor on the first surface 12a side as compared to a difference due to unevenness of the conductor on the second surface 12b side, such that a difference in distance is small between the mounting surface 10a and the exposed portion 15 of the first conductor 12. As a result, a difference in distance from the mounting surface 10a to the mounting electrode is able to be reduced between the exposed portions and/or between production lots, and the occurrence of poor bonding is reduced or prevented at the time of mounting of the mounting substrate.

The distance between the first surface 12a and the mounting surface 10a in a conductor portion is measured as a minimum value of the distance between a surface parallel or substantially parallel to the mounting surface 10a and in contact with the first surface 12a and the mounting surface 10a. The distance between the second surface 12b and the mounting surface 10a in a conductor portion is measured as a maximum value of the distance between a surface parallel or substantially parallel to the mounting surface 10a and in contact with the second surface 12b and the mounting surface 10a. The distance between the first surface 12a and the second surface 12b in a conductor portion is measured as a maximum value of the distance between a surface parallel or substantially parallel to the mounting surface 10a and in contact with the first surface 12a and a surface parallel to the mounting surface 10a and in contact with the second surface 12b.

The first conductor having non-uniform thickness in the direction orthogonal or substantially orthogonal to the mounting surface may be obtained by forming the first conductor by an electroplating method, for example. In FIG. 1, the first surface of the first conductor includes a surface parallel or substantially parallel to the mounting surface, and the second surface has a rounded shape. Such a first conductor is formed through plating growth from the mounting surface side toward the side opposite to the mounting surface of the resin layer 13, for example. In the present preferred embodiment, d1 only needs to be smaller than d2, and the first surface may have a rounded shape. The mounting substrate 10 shown in FIG. 1 may be formed, for example, by causing the plating growth of a conductor on a thermoplastic resin layer and then laminating and collectively pressing a thermoplastic resin on the conductor. While the substrate is able to be formed by a simple process, the conductor is displaced in the lamination direction due to a flow of the thermoplastic resin in this process. Although the first conductor 12 is partially exposed from the resin layer 13 in FIG. 1, the entirety or substantially the entirety of the first conductor 12 may be embedded in the resin layer 13. The mounting substrate 10 may include a smooth insulating base material layer on the mounting surface. The first conductor 12 may include a coil portion having a coil shape and a winding axis A orthogonal or substantially orthogonal to the mounting surface 10A. If the first conductor 12 has a coil portion, the coil shape thereof may be, for example, a planar spiral shape or a meandering coil shape.

Second Preferred Embodiment

Figure 2:
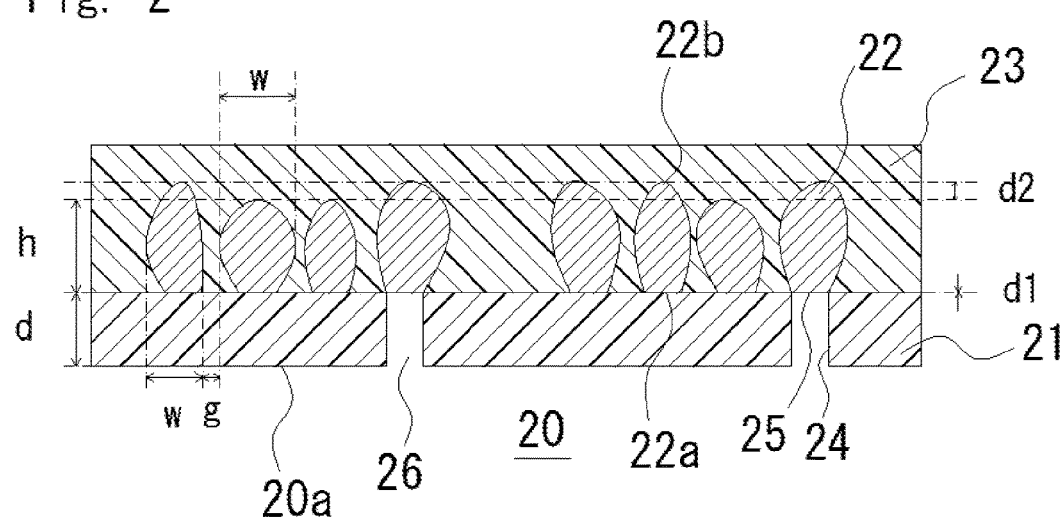
FIG. 2 is an example of a cross-sectional view of a mounting substrate according to a second preferred embodiment of the present invention.

FIG. 2 is a schematic cross-sectional view of a mounting substrate 20 according to a second preferred embodiment of the present invention. The second preferred embodiment may have the same or substantially the same configuration as the first preferred embodiment except that an insulating base material layer 21 and a resin layer 23 are included as a resin layer and that a first conductor 22 is provided in the resin layer 23.

The mounting substrate 20 includes the insulating base material layer 21, a planar spiral-shaped first conductor 22 provided on the insulating base material layer 21, and the resin layer 23 provided on the insulating base material layer 21 and enclosing the first conductor 22. The mounting substrate 20 includes a mounting surface 20a that is a surface of the insulating base material layer 21 on the side opposite to the resin layer 23. The insulating base material layer 21 includes two surfaces orthogonal or substantially orthogonal to the thickness direction having a smooth or substantially smooth planar shape with little unevenness. The first conductor 22 is in contact with the insulating base material layer 21 on the surface opposite to the mounting surface of the insulating base material layer 21. The first conductor 22 has a planar spiral shape on the insulating base material layer 21 and includes a series of conductors spirally extended between an inner circumferential portion and an outer circumferential portion. The first conductor 22 includes a first surface 22a in contact with the insulating base material layer 21 and a second surface 22b on the side opposite to the first surface 22a. The first conductor 22 has a distance between the first surface 22a and the second surface 22b varying along the extension winding direction of the first conductor 22, and the thickness is not uniform in the direction orthogonal or substantially orthogonal to the mounting surface. In the mounting substrate 20, since the first conductor 22 is in contact with the flat plate-shaped insulating base material layer 21, the distance dl between the mounting surface and the first surface 22a is constant or substantially constant over the entire or substantially the entire first conductor 22. Therefore, the difference of the maximum value and the minimum value of the distance between the mounting surface and the first surface is zero or substantially zero. On the other hand, the distance between the mounting surface and the second surface 22b varies along the extending direction of the first conductor 22 and is non-uniform. Therefore, d2 is greater than zero. Thus, the difference dl of the maximum value and the minimum value of the distance between the mounting surface 20a and the first surface 22a is smaller than the difference d2 of the maximum value and the minimum value of the distance between the mounting surface 20a and the second surface 22b. In FIG. 2, since the first surface 22a of the first conductor 22 is in contact with the smooth insulating base layer 21, the first surface 22a is smooth and is provided on the surface parallel or substantially parallel to the mounting surface 20a. As a result, the distance between the mounting surface and the mounting electrode becomes more uniform, and a bonding member is able to sufficiently wrap around to a mounting electrode at the time of mounting, so that the occurrence of bonding failure is more effectively reduced or prevented.

The first conductor 22 has a thickness h in a direction orthogonal or substantially orthogonal to the mounting surface and a width w in a lateral direction on a surface orthogonal or substantially orthogonal to the extending direction of the first conductor 22, for example, in the cross section of FIG. 2, and includes adjacent conductor portions disposed with a gap g on the insulating base material layer 21. The thickness h of the first conductor 22 is measured as a distance between the first surface 22a and the second surface 22b in a conductor portion. The width w and the gap g are measured as a distance between two surfaces parallel or substantially parallel to the winding axis direction and in contact with a conductor portion. Specifically, the thickness h of a conductor portion is measured as a distance between a surface parallel to the mounting surface 20a and in contact with the first surface 22a and a surface parallel or substantially parallel to the mounting surface 20a and in contact with the second surface 22b. The width w is measured as a distance between two surfaces orthogonal or substantially orthogonal to the mounting surface 20a, parallel or substantially parallel to the winding direction, and in contact with a certain conductor portion. The gap g between the conductor portions is measured as a distance between two surfaces orthogonal or substantially orthogonal to the mounting surface 20a, parallel or substantially parallel to the winding direction, and in contact with respective mutually facing surfaces of the conductor portions on the insulating base material layer 21.

In a substrate 29, preferably the thickness h in the winding axis direction of the first conductor 22 may be about 30 μm or more and about 45 μm or less, for example; the width w may be about 25 μm or more and about 45 μm or less, for example; and the gap g may be about 5 μm or more and about 10 μm or less, for example.

In FIG. 2, the thickness h of the first conductor 22 is not a constant value throughout the first conductor 22 in the extending direction and is non-uniform due to a position having a value different from another position. The width w of the first conductor 22 is not a constant value throughout the first conductor 22 in the extending direction and is non-uniform due to a position having a value different from another position.

In the first conductor 22, an average value of a ratio g/h of the gap g between the adjacent conductor portions to the thickness h of one of the two adjacent conductor portions on the insulating base material layer 21 may preferably be, for example, about 0.5 or less, and more preferably about 0.3 or less. The thickness h of one of the two conductor portions is a value of the larger one of the respective thicknesses. The average value is obtained as an average value of ratios calculated at five arbitrary positions. When the average value of the ratio g/h is equal to or less than the predetermined value, a coil is defined by the conductor having a narrow gap, so that the number of turns per unit area of the coil is able to be increased.

In the first conductor 22, the average value of the ratio h/w of the thickness h to the width w may preferably be, for example, about 1 or more. When the average value of the ratio h/w is equal to or greater than the predetermined value, a coil is defined by the conductor with a high aspect ratio, so that the number of turns per unit area of the coil is able to be increased.

In the mounting substrate 20, an average value of the distance d between the mounting surface and the first surface is smaller than the minimum value of the distance between the first surface and the second surface, i.e., the thickness h in the direction orthogonal or substantially orthogonal to the mounting surface of the first conductor 22. As a result, the thickness of the mounting substrate 20 is able to be reduced as a whole. The average value of the distance d between the mounting surface and the first surface is obtained as an average value of measured values at five arbitrary positions. In the substrate 20, the average value of the distance d may preferably be, for example, about 5 μm or more and about 20 μm or less.

Figure 3:
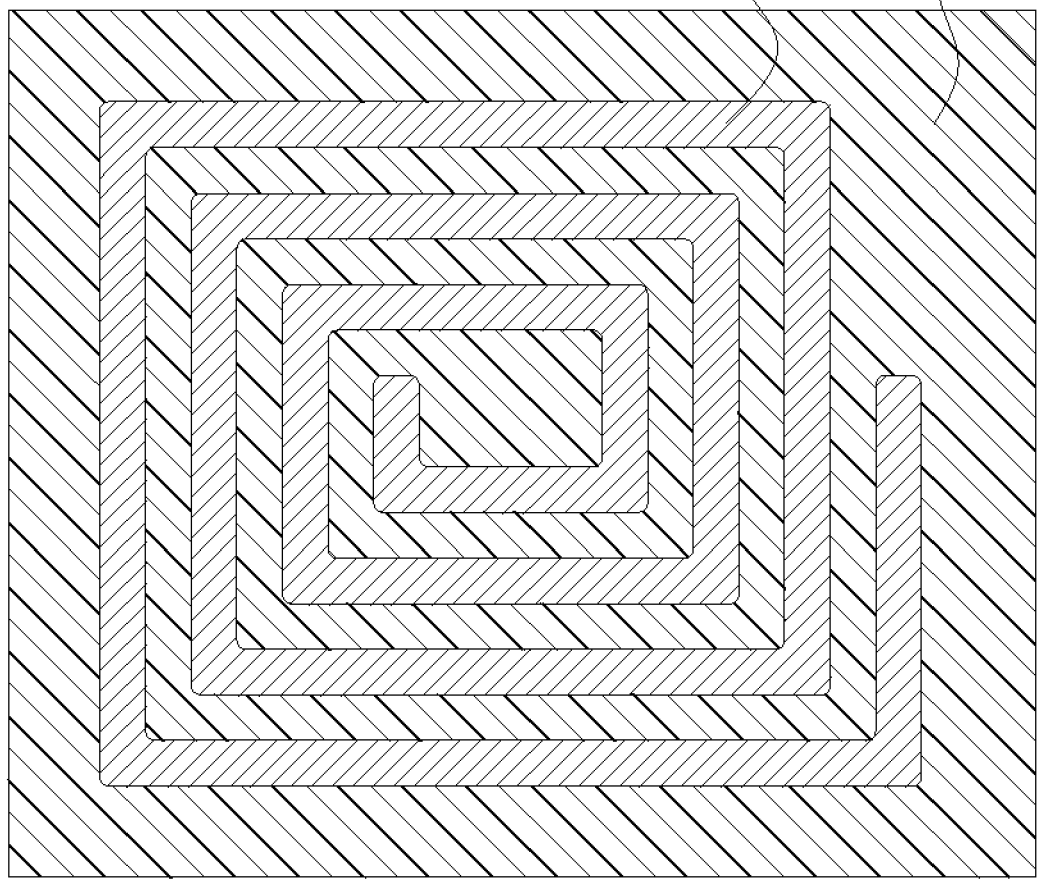
FIG. 3 is an example of an end view of the mounting substrate according to the second preferred embodiment of the present invention in a planar view.

The first conductor 22 preferably has a planar spiral shape, for example. FIG. 3 is an example of an end view of an interface between the insulating base layer 21 and the resin layer 23 of the substrate 20 as viewed from the mounting surface side. In FIG. 3, the first conductor 22 a series of conductors that are connected such that an inner circumferential portion and an outer circumferential portion are spirally extended and provided on a surface. In FIG. 3, the planar spiral shape preferably has a rectangular or substantially rectangular shape including orthogonal or substantially orthogonal linear portions such that the linear portions vary in length for each intersecting straight line. However, the planar spiral shape may have a polygonal shape including straight line portions or may have a circular or substantially circular shape, an elliptical or substantially elliptical shape, or other suitable shapes including curved lines.

Although the first conductor 22 is disposed in the resin layer 23 in FIG. 2, the mounting substrate 20 may not include the resin layer 24. The substrate 20 may further include another insulating base material layer on the surface of the resin layer on the side opposite to the surface in contact with the insulating base material layer 21. The insulating base material layer 21 and the resin layer 24 may be made of the same material or different materials. The insulating base material layer may preferably be made of, for example, a thermoplastic resin such as a liquid crystal polymer (LCP) or a thermosetting resin such as an epoxy resin. For example, the resin layer 24 may be made of an insulating resin slurry having fluidity, and the insulating resin may be either a thermoplastic resin or a thermosetting resin. By making the resin layer 23 with insulating resin slurry having fluidity, the first surface 22a is on the same or substantially the same plane without causing a positional displacement of the first conductor 22 in the lamination direction.

The insulating base material layer 21 includes an opening portion 26 in which an exposed portion 25 is defined by a portion of the first surface that is a contact surface in contact with the insulating base material layer 21 on the first conductor 22. The opening portion 26 is disposed in the thickness direction of the insulating base material layer 21 and is surrounded by a resin wall portion 24. The exposed portion 25 of the first conductor 22 in the opening portion 26 defines a mounting electrode. The mounting electrode may be the exposed portion 25 itself of the first conductor 22 or an exposed surface plated with gold, nickel-gold, or other suitable material, for example.

In the mounting substrate 20, the mounting electrode is defined by the exposed portion 25 of the first conductor 22, so that the distance between the surface of the mounting electrode and a mounting surface is constant or substantially constant over the entire or substantially the entire surface of the mounting electrode. As a result, solder is able to sufficiently wrap around to the mounting electrode, so that the occurrence of bonding failure is reduced or prevented, and the mounting strength is improved. Additionally, since a difference in distance from the mounting surface to the mounting electrode is reduced, the occurrence of bonding failure is reduced or prevented.

Figure 4A:
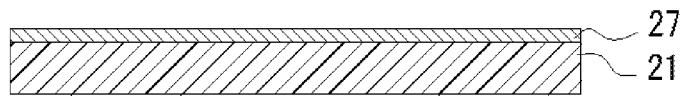
FIGS. 4A to 4G show a schematic of a manufacturing process of the mounting substrate according to the second preferred embodiment of the present invention.
Figure 4B:
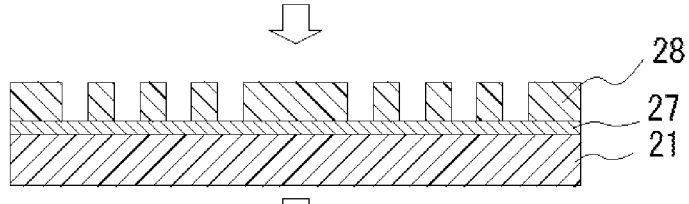
Figure 4C:
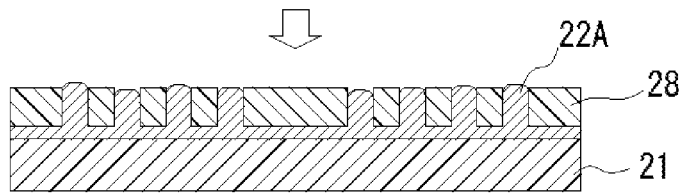
Figure 4D:
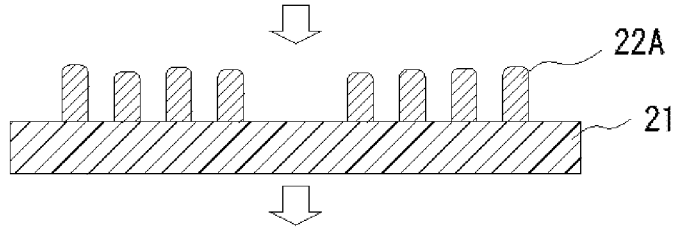
Figure 4E:
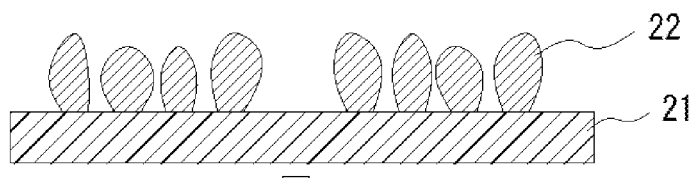
Figure 4F:
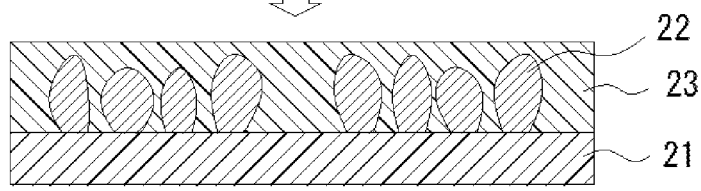
Figure 4G:
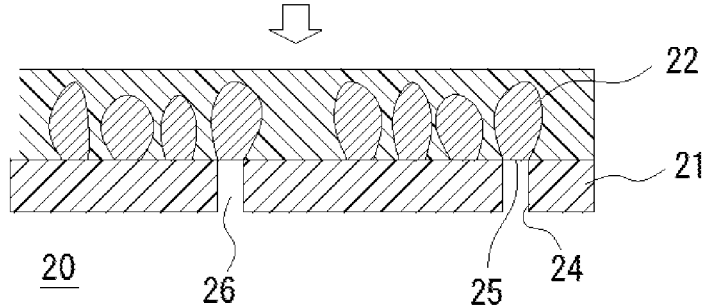

FIGS. 4A to 4G are schematic views of a non-limiting example of a manufacturing process of the mounting substrate 20 according to the second preferred embodiment. In FIG. 4A, the insulating base material layer 21 is prepared that includes an underlying metal layer 27 on the surface opposite to the surface defining the mounting surface. The insulating base material layer 21 preferably includes, for example, an insulating thermoplastic resin, such as an epoxy resin and a liquid crystal polymer. The underlying metal layer 27 may be formed by laminating a metal foil with the insulating base material layer 21 or may be formed by electroless plating of the insulating base material layer 21. The underlying metal layer 27 preferably includes metallic copper, for example. In FIG. 4B, a resist 28 defining a template of conductors 22A is formed on the underlying metal layer 27 using photolithography, for example. The resist 28 is formed such that the underlying metal layer 27 is exposed in a planar spiral shape. In FIG. 4C, the conductors 22A are formed through plating growth on the underlying metal layer 27 by electroplating. The conductors 22A are formed along the shape of the resist 28. The conductors 22A formed by electroplating have thickness slightly varying between the adjacent conductors 22A and include an uppermost surface forming a curved surface of an arc shape etc., as the end portion of the plating growth. The electroplating is performed by precipitating the metallic copper, for example. In FIG. 4D, the resist 28 is removed. At the time of removal of the resist 28, the portion of the underlying metal layer 27 covered with the resist 28 is removed at the same time to expose the insulating base material layer 21 between the conductors 22A. The underlying metal layer 27 may be removed by etching. In FIG. 4E, the conductors 22A are further grown by electroplating to form the first conductor 22. This plating growth is performed by precipitating the metallic copper, for example. Since the first conductor 22 is obtained through the plating growth of the conductors 22A, the ratio h/w of the thickness h to the width w in the cross section of the first conductor 22 is preferably larger than about 1, and the thickness and the width are non-uniform along the extending direction of the conductor 22. In the first conductor 22 formed through the plating growth, the gap between the adjacent conductors becomes narrower than before the plating growth. In FIG. 4F, the insulating resin layer 23 is arranged on the insulating base material 21 to cover the first conductor 22. The first conductor 22 is enclosed in the insulating resin layer 23. The resin layer 23 preferably includes, for example, a thermoplastic resin or a thermosetting resin such as an epoxy resin. A slurry material having fluidity may be used to form the resin layer 23. Using the slurry material prevents formation of a void between the conductor portions of the first conductor 22, and the resin layer 23 leveled without a gap is able to be formed on the insulating base material layer 21. Furthermore, the first conductor 22 is restrained from non-uniformly projecting toward the mounting surface due to deformation of the insulating base material layer 21. In FIG. 4G, the opening portion 26 is formed in the insulating base layer 21 in the thickness direction of the insulating base layer 21 from the mounting surface side toward the first surface of the first conductor 22. In the opening portion 26, a mounting electrode is formed of an exposed portion of the first surface in contact with the insulating base material layer 21 on the first conductor 22. The opening portion 26 is surrounded by the resin wall portion 24 of the insulating base material layer 21. The opening portion 26 may preferably be formed using a laser, for example. With the manufacturing process described above, the mounting substrate 20 is manufactured.

Figure 5A:
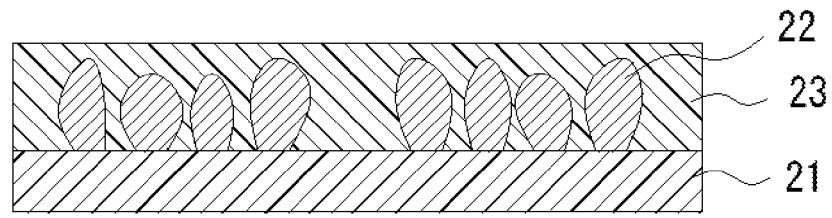
FIGS. 5A to 5D show a schematic of another manufacturing process of the mounting substrate according to the second preferred embodiment of the present invention.
Figure 5B:
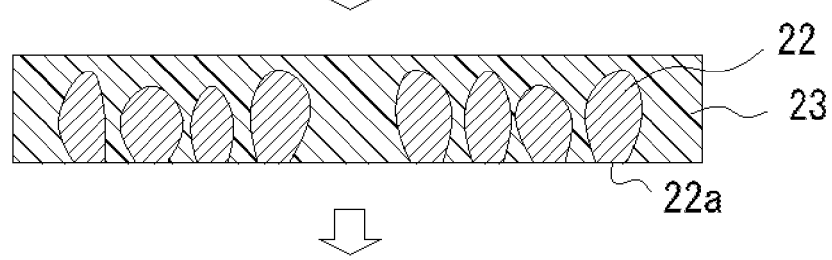
Figure 5C:
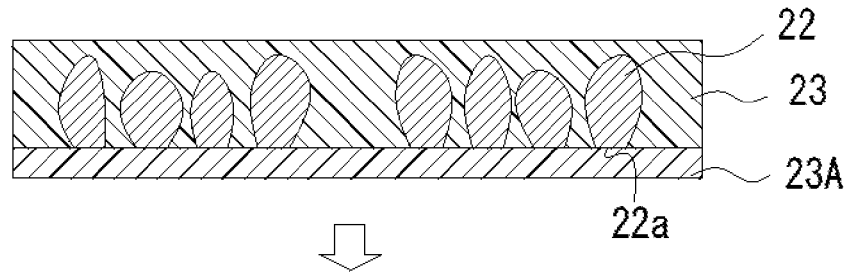
Figure 5D:
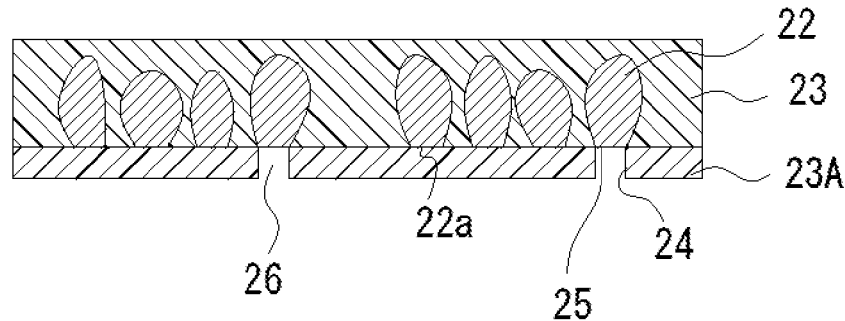

FIGS. 5A to 5D are schematic views of a non-limiting example of a manufacturing process of a modified example of the mounting substrate 20 according to the second preferred embodiment. In FIG. 5A, a substrate is prepared that includes the insulating base material layer 21, the first conductor 22 in contact with the insulating base material layer 21, and the insulating resin layer 23 laminated and arranged on a surface on which the first conductor 22 of the insulating base material layer 21 is disposed. The substrate of FIG. 5A may be obtained in the manufacturing process of FIGS. 4A to 4F, for example. In FIG. 5B, the insulating base material layer 21 is peeled from the resin layer 23. By peeling off the insulating base material layer 21, a substrate including the resin layer 23 and the first conductor 22 including a contact surface in contact with the resin layer 23 is obtained. In the substrate of FIG. 5B, the first surface 22a of the first conductor 22 is exposed on the surface of the resin layer 23 on the mounting surface side. In FIG. 5C, a resist 23A is laminated on the surface of the resin layer 23 on the mounting surface side. The resist 23A preferably includes a thermoplastic resin or a thermosetting resin, for example. The resist 23A may be laminated using the same material as the resin layer 23 or may be laminated using a different material. By arranging the resist 23A on the mounting surface side of the resin layer 23, the first surface 22a of the first conductor 22 is covered with insulating coating. A surface of the resist 23A opposite to the resin layer 23 is smoothly formed as a mounting surface. In FIG. 5D, the opening portion 26 is formed in the thickness direction of the resist 23A from the mounting surface side of the resist 23A toward the first surface 22a of the first conductor 22. In the opening portion 26, the first surface 22a of the first conductor 22 is partially exposed as the exposed portion 25, so as to define the mounting electrode. The opening portion 26 is surrounded by the resin wall portion 24 of the resist 23A.

Third Preferred Embodiment

Figure 6:
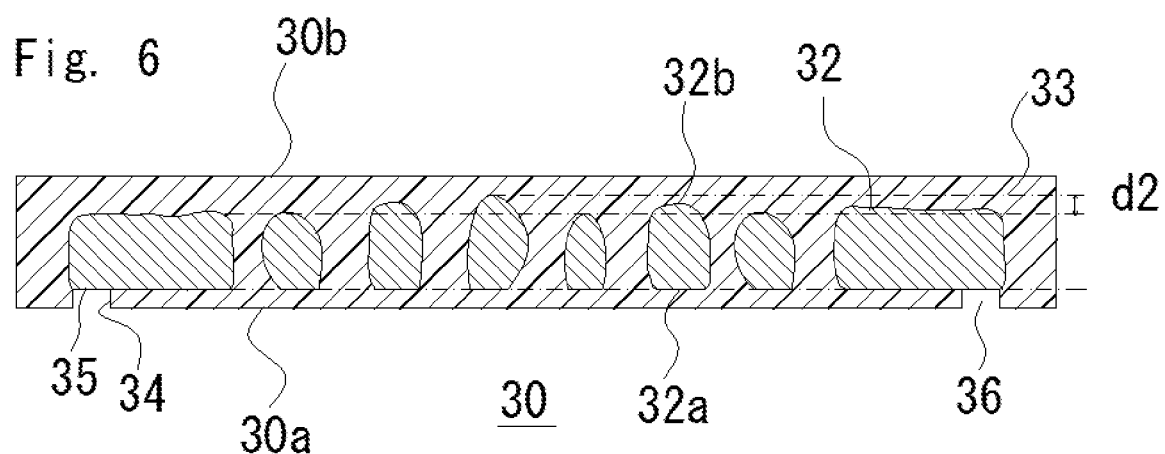
FIG. 6 is an example of a cross-sectional view of a mounting substrate according to a third preferred embodiment of the present invention.

FIG. 6 is a schematic cross-sectional view of a mounting substrate 30 according to a third preferred embodiment of the present. The third preferred embodiment may have the same or substantially the same configuration as the first preferred embodiment, except that a first conductor 32 is enclosed in a resin layer 33, a first surface of the first conductor 32 is provided on the same or substantially the same plane, the first conductor includes a first coil portion 32a and a connecting portion 32b provided continuously from the first coil portion and includes a mounting electrode on the connecting portion 32b. In FIG. 6, since the first surface of the first conductor 32 is provided on the same or substantially the same plane, the difference dl of the maximum value and the minimum value of the distance between the mounting surface 30a and the first surface 32a is zero or substantially zero, while the difference d2 of the maximum value and the minimum value of the distance between the mounting surface 30a and the second surface 32b is larger than zero. In FIG. 6, the first conductor 32 having a non-uniform thickness in the direction orthogonal or substantially orthogonal to the mounting surface is formed through plating growth from the first surface 32a side of the first conductor 32 in the direction toward the surface of the resin layer 33 opposite to the mounting surface 30a.

Figure 7:
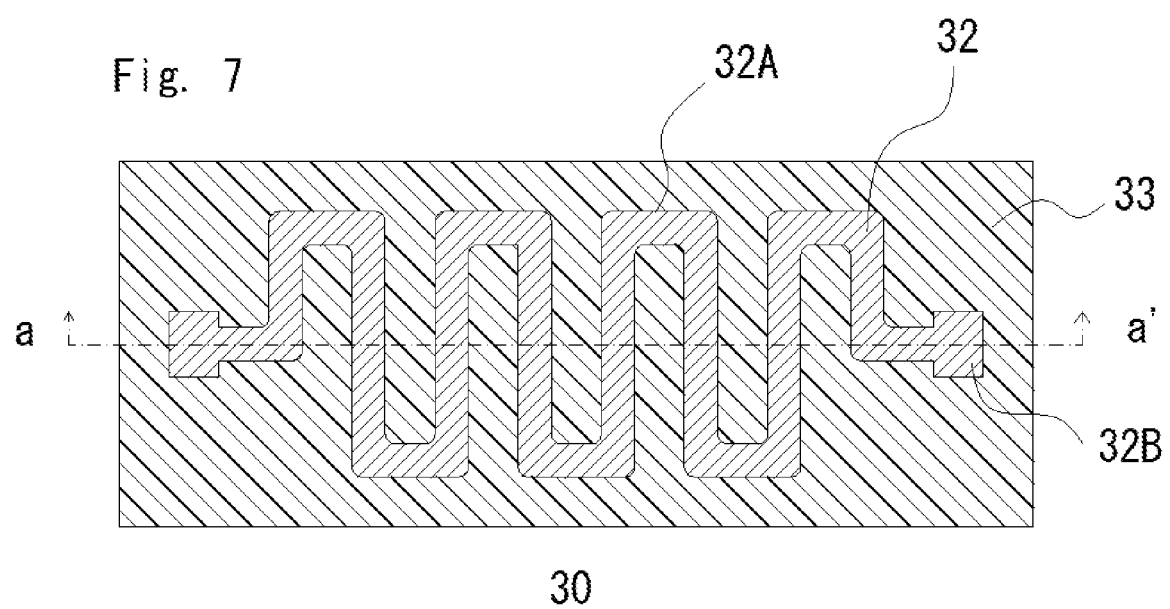
FIG. 7 is an example of an end view of the mounting substrate according to the third preferred embodiment of the present invention in a planar view.

FIG. 7 is a plan view of the mounting substrate 30 as viewed from the mounting surface 30a side and is an end view on a plane on which the first surface 32a of the first conductor 32 is provided. The first conductor 32 includes a coil portion 32A with a meander coil pattern and a connecting portion 32B, and the coil portion 32A and the connecting portion 32B may preferably be continuously formed using an electroplating method, for example. A cross-sectional view taken along a cutting line a-a' in FIG. 7 corresponds to FIG. 6.

Fourth Preferred Embodiment

FIG. 8 is a schematic cross-sectional view of to mounting substrate 40 according to a fourth preferred embodiment of the present invention. The mounting substrate 40 according to the fourth preferred embodiment may have the same or substantially the same configuration as the mounting substrate 20 of the second preferred embodiment, except that the substrate includes not only a first conductor 42A but also a second conductor 42B provided on a first resin layer 43A and connected to the first conductor 42A, and that the substrate includes a first connecting conductor 42C provided on an insulating base material 41 in contact therewith, connected to the second conductor 42B, and exposing a contact surface in contact with the insulating base material 41 in an opening portion 46, and a second resin layer 43B provided on the first resin layer 43A and covering the second conductor 42B. Since the mounting substrate 40 according to the fourth preferred embodiment includes a planar spiral-shaped conductor on two layers, for example, an electromagnetic field generated by a driving current is increased, so that a larger driving force is able to be obtained by applying the mounting substrate 40 to a vibration plate.

The mounting substrate 40 includes the insulating base material layer 41, the planar spiral-shaped first conductor 42A provided on the insulating base material layer 41 in contact therewith, the first connecting conductor 42C in contact with the insulating base material layer 41 and separated from the first conductor 42A, the first resin layer 43A provided on the insulating base material layer 41 and covering the first conductor 42A and a first connecting conductor 43C, the second conductor 42B provided on the first resin layer 43A, connected to the first conductor 42A and the first connecting conductor 42C, and having a planar spiral shape, and the second resin layer 43B provided on the first resin layer 43A and covering the second conductor 42B. The insulating base material layer 41 includes an opening portion exposing an exposed portion 45A of a first surface that is a contact surface of the first conductor 42A in contact with the insulating base material layer 41 and an exposed portion 45C that is a contact surface of the first connecting conductor 42C in contact with the insulating base layer 21. The opening portion 46 is disposed along the thickness direction of the insulating base material layer 41 and is surrounded by a resin wall portion 44 of the insulating base material layer 41. The exposed portion 45A of the first conductor 42A and the exposed portion 45C of the first connecting conductor 42C in the opening portion 46 define mounting electrodes.

In the mounting substrate 40, since the first surface of the first conductor 42A is provided on the same or substantially the same plane, the difference dl of the maximum value and the minimum value of the distance between a mounting surface 40a and a first surface 42Aa is zero or substantially zero. However, the difference d2 of the maximum value and the minimum value of the distance between the mounting surface 40a and the second surface 42Ab is larger than zero. In the mounting substrate 40, the first conductor 42A having a non-uniform thickness in the direction orthogonal or substantially orthogonal to the mounting surface 40a is formed through plating growth from the side opposite to the mounting surface of the insulating base material layer 41 in the direction toward the surface opposite to the mounting surface 40a.

In the mounting substrate 40, the second conductor 42B is in contact with the first resin layer 43A on the surface of the first resin layer 43A on the side opposite to the insulating base material layer 41. The second conductor 42B is connected via a second connecting conductor 49 to both of the first conductor 42A and the first connecting conductor 43C. In the mounting substrate 40, since a first surface 42Ba of the second conductor 42B is provided on the same or substantially the same plane, the difference dl of the maximum value and the minimum value of the distance between the mounting surface 40a and the first surface 42Ba of the second conductor 42B is zero or substantially zero. However, the difference d2 of the maximum value and the minimum value of the distance between the mounting surface 40a and a second surface 42Bb of the second conductor 42B is larger than zero. In the mounting substrate 40, the second conductor 42B having a non-uniform thickness in the direction orthogonal or substantially orthogonal to the mounting surface is formed through plating growth from the surface of the first resin layer 43A opposite to the insulating base material layer in the direction toward the surface opposite to the mounting surface 40a. The second conductor 42B is covered with the second resin layer 43B disposed on the first resin layer 43A and covering the second conductor 42B and is enclosed in the second resin layer 43B.

In the mounting substrate 40, the first connecting conductor 42C disposed on the insulating base material layer 41 and including the contact surface in contact with the insulating base material layer 41 partially exposed in the opening portion 46 is connected via the second connecting conductor 49 to an outer circumferential portion of the second conductor 42B. An inner circumferential portion of the second conductor 42B is connected via the second connecting conductor 49 to an inner circumferential portion of the first conductor 42A. An outer circumferential portion of the first conductor 42A includes the contact surface 45A in contact with the insulating base material layer exposed in the opening portion 46. As a result, a conductor coil includes a series of two planar spiral-shaped conductors from the first connecting conductor 42C via the second conductor 42B to the outer circumference of the first conductor 42A. Although two planar spiral-shaped conductors are connected in FIG. 8, one conductor coil may be provided by connecting three or more planar spiral-shaped conductors.

Figure 9A:
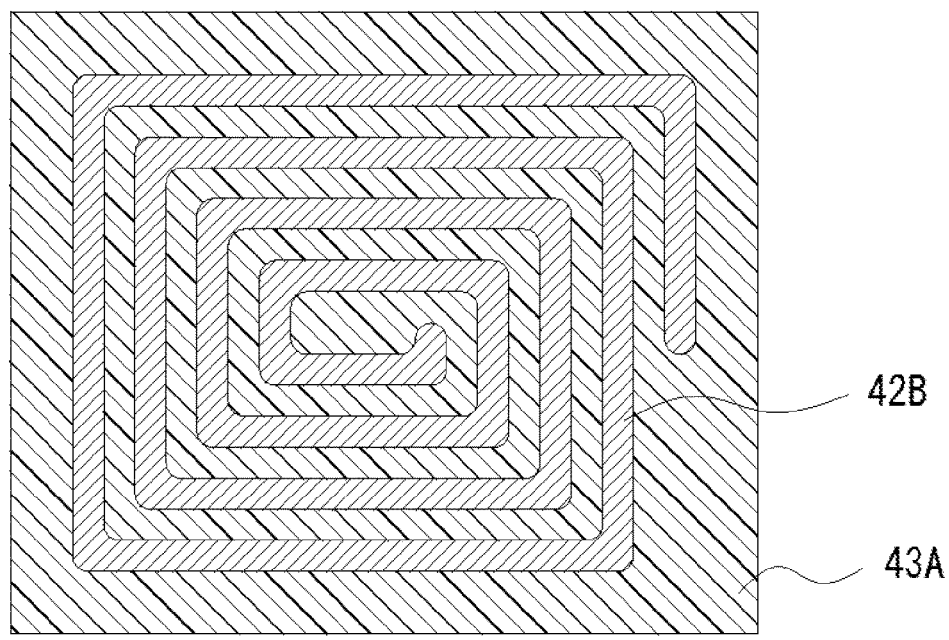
FIGS. 9A and 9B are examples of end views of the mounting substrate according to the fourth preferred embodiment of the present invention in a plan view.
Figure 9B:
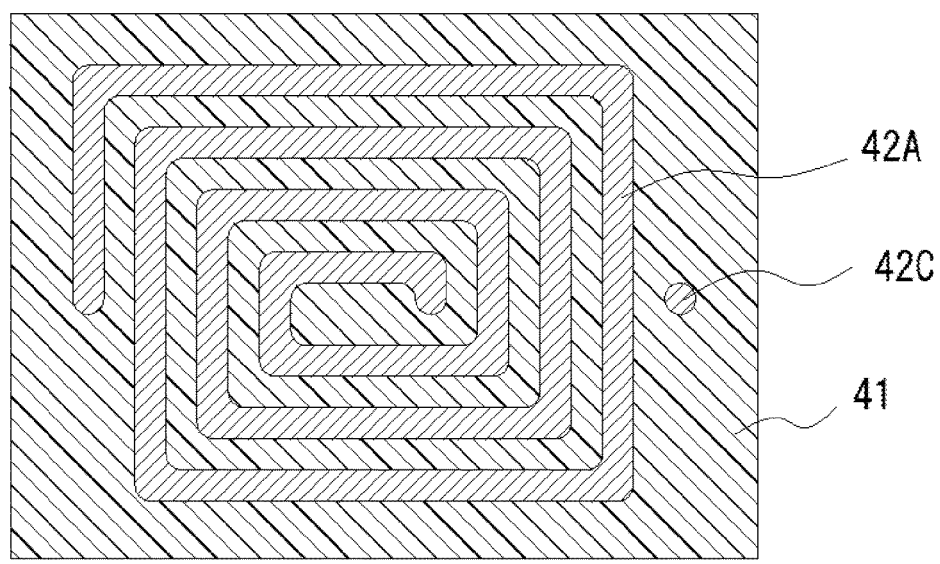

FIG. 9A is an end view of an interface between the first resin layer 43A and the second resin layer 43B of the mounting substrate 40 as viewed in the lamination direction toward the mounting surface, and FIG. 9B is an end view of an interface between the first resin layer 43A and the insulating base material layer 41 of the mounting substrate 40 as viewed in the lamination direction toward the mounting surface. In FIG. 9A, the second conductor 42B has a planar spiral shape on the first resin layer 43A. The end view of FIG. 9A shows the shape of the contact surface of the second conductor 42B in contact with the first resin layer 43A. In FIG. 9B, the first conductor 42A has a planar spiral shape on the insulating base material layer 41, and the first connecting conductor 42C is provided at a position corresponding to an end portion of the outer circumferential portion of the second conductor 42B. The end view of FIG. 9B shows the shape of the contact surface of the first conductor 42A and the first connecting conductor 42C in contact with the insulating base material layer 41. An end portion of the outer circumferential portion of the second conductor 42B is connected to the first connecting conductor 42C via the second connecting conductor disposed in the lamination direction. An end portion of the inner circumferential portion of the second conductor 42B is connected to an end portion of the inner circumferential portion of the first conductor 42A via the second connecting conductor disposed in the laminating direction. The end portion of the outer circumferential portion of the first conductor 42A and the first connecting conductor 42C are exposed in opening portions provided in the insulating base material layer 41 to define mounting electrodes. In FIGS. 9A and 9B, the first conductor 42A and the second conductor 42B define a planar spiral shape including linear portions. However, the planar spiral shape may include, for example, circular, substantially circular, elliptical, or substantially elliptical curved portions.

Figure 10A:
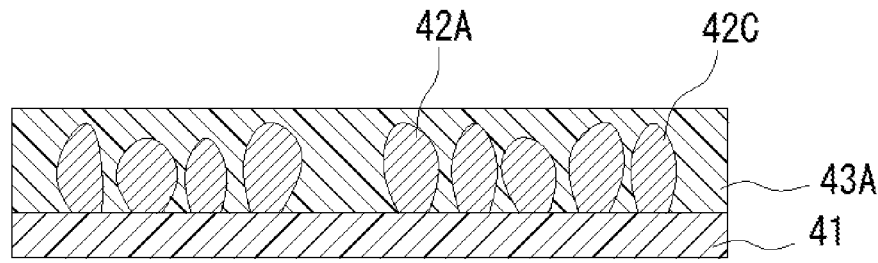
FIGS. 10A to 10E show a schematic of a manufacturing process of the mounting substrate according to the fourth preferred embodiment of the present invention.
Figure 10B:
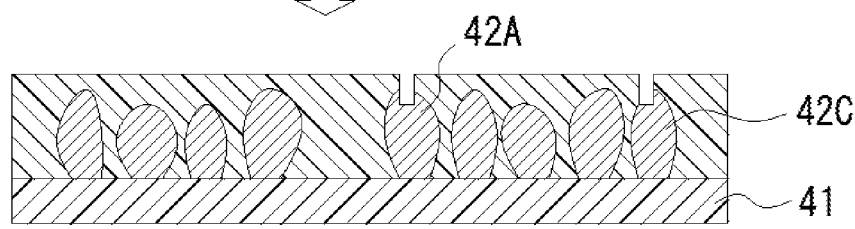
Figure 10C:
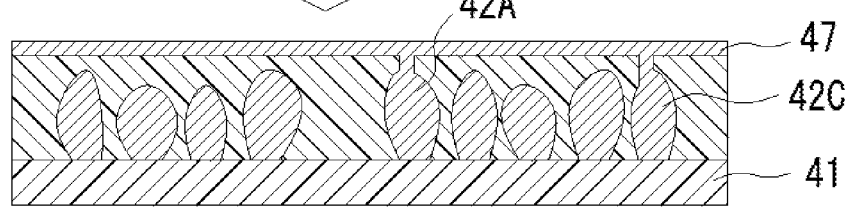
Figure 10D:
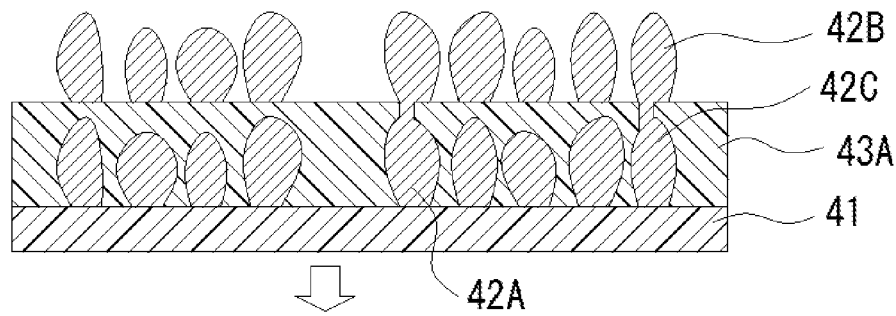
Figure 10E:
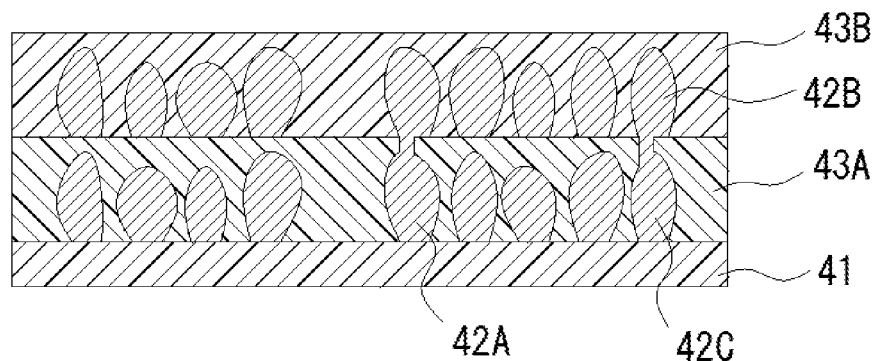

FIGS. 10A to 10E are schematic views of a non-limiting example of a manufacturing process of the mounting substrate 40 according to the fourth preferred embodiment. In FIG. 10A, the insulating base material layer 41 is prepared that includes the first conductor 42A having a planar spiral shape, the first connecting conductor 42C arranged separately from the first conductor 42A, and the first resin layer 43A covering the first conductor 42A and the first connecting conductor 42C arranged on a surface opposite to the mounting surface. The method described with reference to FIGS. 4A to 4F may be applied to a method of arranging the first conductor 42A and the first connecting conductor 42C on the insulating base material layer 41 and covering with the first resin layer 43A. In FIG. 10B, respective hole portions extending to the first conductor 42A and the first connecting conductor 42C are formed in the lamination direction from the surface of the first resin layer 43A opposite to the insulating base material layer 41. The hole portions may be formed using a laser or a drill, for example. In FIG. 10C, an underlaying metal layer 47 is formed on the surface of the first resin layer 43A on the side opposite to the insulating base material layer 41. In this process, underlaying metal layers are also formed in the hole portions disposed in the first resin layer 43A and connected to the first conductor 42A and the first connecting conductor 42C as well as the underlaying metal layer 47 on the first resin layer 43A. The underlaying metal layer 47 may be formed by electroless plating, for example. In FIG. 5D, on the underlaying metal layer 47 formed in FIG. 5C, the second conductor 42B may be formed as in the method described with reference to FIGS. 4A to 4E. In FIG. 10E, the second resin layer 43B covering the second conductor 42B is formed on the first resin layer 43A to obtain a laminated body having the second conductor 42B enclosed in the second resin layer 43B. In the insulating base material layer 41 of the obtained laminated body, opening portions are formed in the thickness direction of the insulating base material layer 41 from the mounting surface side toward the first conductor 42A and the first connecting conductor 42C. In the opening portions, the contact surfaces of the first conductor 42A and the first connecting conductor 42C in contact with the insulating base layer 21 are exposed to define the mounting electrodes. With the manufacturing process described above, the mounting substrate 40 as shown in FIG. 8 is manufactured.

Fifth Preferred Embodiment

Figure 11:
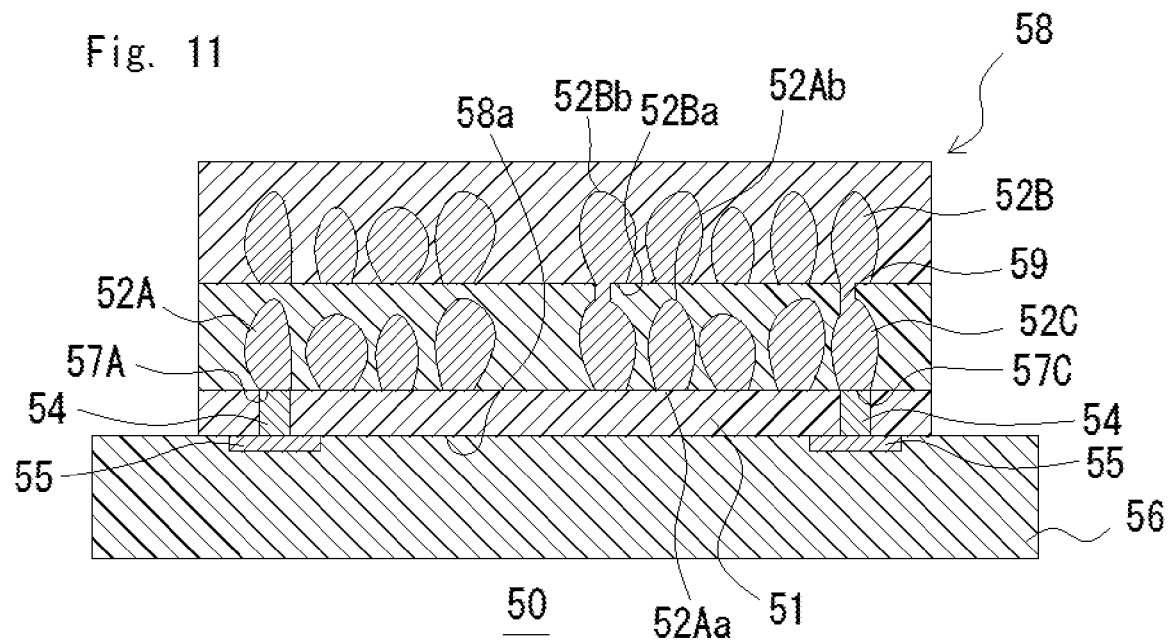
FIG. 11 is an example of a cross-sectional view of an electric element according to a fifth preferred embodiment of the present invention.

FIG. 11 is a schematic cross-sectional view of an electric element 50 according to a fifth preferred embodiment of the present invention. The electric element 50 includes a mounting substrate 58 according to the fourth preferred embodiment and a support substrate 56 on which the mounting substrate 58 is mounted. The support substrate 56 includes connection terminals 55, and the mounting substrate 58 includes mounting electrodes 57A and 57C respectively bonded to the connection terminals 55 via bonding members 54. The bonding members 54 are preferably provided using solder, for example. The mounting electrode 57A includes an exposed portion of a first surface 52Aa that is a contact surface of the first conductor 52A, which is enclosed in the mounting substrate 58, and in contact with the insulating base material layer 51, and the mounting electrode 57C is defined by a first surface of the first connecting conductor 52C and the insulating base material layer 51, so that the occurrence of bonding failure is reduced or prevented at the time of mounting, and the electric element 50 having an improved bonding strength is provided.

Sixth Preferred Embodiment

Figure 12:
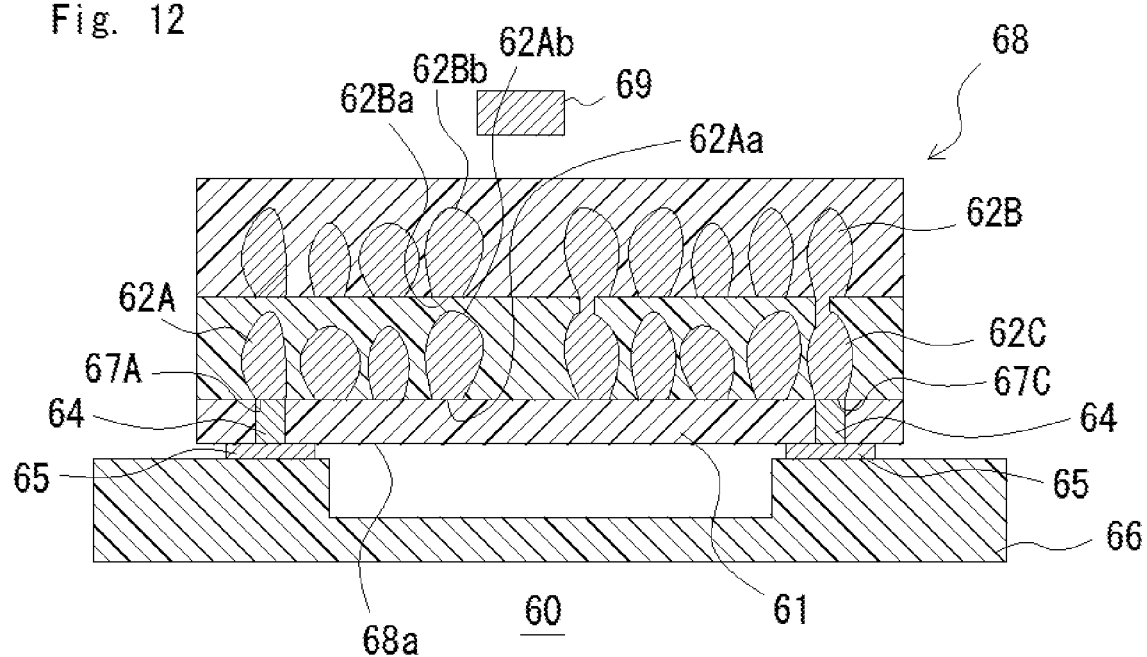
FIG. 12 is an example of a cross-sectional view of an electric element according to a sixth preferred embodiment of the present invention.

FIG. 12 is a schematic cross-sectional view of an electric element 60 according to a sixth preferred embodiment of the present invention. The electric element 60 includes a mounting substrate 68 according to the fourth preferred embodiment, a housing 66 supporting the mounting substrate 68, and a magnet 69. The magnet 69 is provided on the side opposite to a mounting surface 68a of the mounting substrate 68. The magnet 69 faces a first conductor 62A and a second conductor 62B having a planar spiral shape. The magnetic flux of the magnet 69 passes through the spiral shape of the first conductor 62A and the second conductor 62B in the winding axis direction thereof. The housing 66 includes connection terminals 65, and mounting electrodes 67A and 67C of the mounting substrate 68 are respectively bonded to the connection terminals 65 via bonding members 64. When the electric element 60 is included in an electronic device, the connection terminals 65 are connected to a circuit of the electronic device. Since a driving current is applied through the mounting electrodes 67A and 67C to a spiral-shaped coil defined by the conductors embedded in the mounting substrate 68, the mounting substrate 68 moves in the lamination direction of the mounting substrate 68 according to the driving current and the electric element 60 is able to be configured to provide a vibrating plate. The bonding members 64 may preferably be provided using solder, for example. The mounting electrode 67A is defined by an exposed portion of a first surface 62Aa that is a contact surface of the first conductor 62A, which is enclosed in the mounting substrate 68, and the insulating base material layer 61, and the mounting electrode 67C is defined by an exposed portion of a first surface of the first connecting conductor 62C in contact with the insulating base material layer 61, so that the occurrence of bonding failure is reduced or prevented at the time of mounting, and the electric element 60 having a favorable bonding strength is provided.

Although the electric element 60 of the sixth preferred embodiment includes the magnet 69 disposed on the side opposite to the mounting surface of the mounting substrate 68, the magnet may be disposed on the mounting surface side. By disposing the magnet on the mounting surface side, a distance between an area of the planar spiral-shaped first conductor 62A close to the magnet and the magnet is not affected by the non-uniformity of the thickness of the first conductor, so that variations of characteristics are reduced or prevented among the electric elements.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A mounting substrate comprising:
a resin layer; and
a first conductor including a contact surface in contact with the resin layer; wherein
the resin layer has a smooth mounting surface;
the first conductor includes a first surface facing toward the mounting surface and a second surface on a side opposite to the first surface and extends in a direction parallel or substantially parallel to the mounting surface;
the first conductor has a non-uniform thickness varying a distance between the first surface and the second surface along an extending direction;
the first conductor has a difference of a maximum value and a minimum value of a distance between the first surface and the mounting surface that is smaller than a difference of a maximum value and a minimum value of a distance between the second surface and the mounting surface;
the resin layer includes a resin wall portion surrounding an opening portion partially exposing the first conductor on the mounting surface side;
the first conductor includes an exposed portion defining a mounting electrode.

2. The mounting substrate according to claim 1, wherein the first surface of the first conductor is provided on a plane parallel or substantially parallel to the mounting surface.

3. The mounting substrate according to claim 1, wherein the first conductor includes a first coil portion having a winding axis orthogonal or substantially orthogonal to the mounting surface and wound to define a contact surface with the resin layer.

4. The mounting substrate according to claim 3, wherein the first coil portion has an average value of about 1 or more of a ratio of a thickness in a direction of the winding axis to a thickness in a width direction orthogonal or substantially orthogonal to the winding axis direction and the extending direction.

5. The mounting substrate according to claim 3, wherein the first coil portion includes adjacent conductor portions and has an average value of about 0.5 or less of a ratio of a gap between the adjacent conductor portions to the thickness of one of the conductor portions.

6. The mounting substrate according to claim 3, wherein the first coil portion has a planar spiral shape.

7. The mounting substrate according to claim 1, further comprising:
a second conductor including a contact surface in contact with the resin layer and connected to the first conductor; wherein
the second conductor includes a first surface facing toward the mounting surface and a second surface on the side opposite to the first surface and extends in a direction parallel or substantially parallel to the mounting surface; and
the second conductor has a non-uniform thickness varying a distance between the first surface and the second surface along the extending direction.

8. The mounting substrate according to claim 7, wherein a difference of a maximum value and a minimum value of a distance between the first surface of the second conductor and the mounting surface is smaller than a difference of a maximum value and a minimum value of a distance between the second surface of the second conductor and the mounting surface.

9. The mounting substrate according to claim 7, wherein the first surface of the second conductor is provided on a plane parallel or substantially parallel to the mounting surface.

10. The mounting substrate according to claim 7, wherein the second conductor includes a second coil portion having a winding axis orthogonal or substantially orthogonal to the mounting surface and wound to define a contact surface with the resin layer.

11. The mounting substrate according to claim 10, wherein the second coil portion has an average value of about 1 or more of a ratio of a thickness in the winding axis direction to a thickness in a width direction orthogonal or substantially orthogonal to the winding axis direction and a winding direction.

12. The mounting substrate according to claim 10, wherein the second coil portion includes adjacent conductor portions and has an average value of about 0.5 or less of a ratio of a gap between the adjacent conductor portions to the thickness of one of the conductor portions.

13. The mounting substrate according to claim 10, wherein the second coil portion has a planar spiral shape.

14. The mounting substrate according to claim 1, wherein an average value of the distance between the mounting surface and the first surface of the first conductor is smaller than a minimum value of the distance between the first surface of the first conductor and the second surface of the first conductor.

15. An electric element comprising:
the mounting substrate according to claim 1; and
a support substrate including a connection terminal; wherein
the mounting electrode of the mounting substrate is bonded via a bonding member to the connection terminal of the support substrate.

16. The electric element according to claim 15, wherein the first surface of the first conductor is provided on a plane parallel or substantially parallel to the mounting surface.

17. A vibrating plate comprising:
the mounting substrate according to claim 1.

18. An electric component comprising:
the mounting substrate according to claim 1;
a housing including a connection terminal; and
a magnet; wherein
the mounting electrode of the mounting substrate is bonded via a bonding member to the connection terminal; and
the magnet is provided on a side opposite to the mounting surface of the mounting substrate.

19. The electric component according to claim 18, wherein the first surface of the first conductor is provided on a plane parallel or substantially parallel to the mounting surface.

* * * * *